United States Patent
Chen et al.

(10) Patent No.: US 7,742,353 B2
(45) Date of Patent: Jun. 22, 2010

(54) SOLID STATE SEMICONDUCTOR STORAGE DEVICE WITH TEMPERATURE CONTROL FUNCTION, APPLICATION SYSTEM THEREOF AND CONTROL ELEMENT THEREOF

(75) Inventors: Ming-Dar Chen, Hsinchu (TW);
Chuan-Sheng Lin, Jhubei (TW);
Hui-Neng Chang, Bade (TW);
Hsiang-An Hsieh, Chung Ho (TW)

(73) Assignee: A-Data Technology Co., Ltd., Taipiei (TW)

( * ) Notice: Subject to any disclaimer, the term of this patent is extended or adjusted under 35 U.S.C. 154(b) by 134 days.

(21) Appl. No.: 12/076,672

(22) Filed: Mar. 21, 2008

(65) Prior Publication Data
US 2009/0091996 A1 Apr. 9, 2009

(30) Foreign Application Priority Data
Oct. 9, 2007 (TW) .............................. 96137875 A

(51) Int. Cl.
*G11C 11/34* (2006.01)
(52) U.S. Cl. .................. 365/212; 365/211; 365/196
(58) Field of Classification Search ................ 365/211, 365/212, 196
See application file for complete search history.

(56) References Cited
U.S. PATENT DOCUMENTS

| | | | |
|---|---|---|---|
| 6,617,963 B1 * | 9/2003 | Watters et al. ........... 340/10.41 |
| 6,661,724 B1 * | 12/2003 | Snyder et al. ............... 365/211 |
| 6,718,406 B2 | 4/2004 | Lin et al. |
| 6,725,321 B1 | 4/2004 | Sinclair et al. |
| 6,829,190 B1 * | 12/2004 | Snyder et al. ............... 365/211 |
| 6,850,125 B2 * | 2/2005 | Norman et al. ............... 331/65 |
| 6,868,025 B2 * | 3/2005 | Hsu ........................... 365/211 |
| 6,967,884 B2 * | 11/2005 | Hsu ........................... 365/211 |
| 7,035,137 B2 * | 4/2006 | Iwata et al. ................. 365/158 |
| 7,129,560 B2 * | 10/2006 | Hamann et al. ............. 257/529 |
| 7,131,767 B2 * | 11/2006 | Socci et al. ................. 374/152 |
| 7,145,824 B2 * | 12/2006 | Bill et al. .................... 365/212 |
| 7,237,086 B1 * | 6/2007 | Kothandapani et al. ........ 712/8 |
| 7,411,757 B2 * | 8/2008 | Chu et al. .................... 360/69 |
| 7,502,705 B2 * | 3/2009 | Bieswanger et al. ........ 702/116 |
| 2005/0010717 A1 | 1/2005 | Ng et al. |

* cited by examiner

*Primary Examiner*—Viet Q Nguyen
(74) *Attorney, Agent, or Firm*—Rosenberg, Klein & Lee

(57) ABSTRACT

A solid state semiconductor storage device with temperature control function comprises a non-volatile memory unit, a temperature sensing element, and a control unit. The temperature sensing element is used for sensing the operation temperature of the solid state semiconductor storage device so as to provide a temperature sensing signal to the control unit. According to the temperature sensing signal, the control unit controls the operation mode of the solid state semiconductor storage device for achieving the function of temperature control.

15 Claims, 8 Drawing Sheets

| Temperature threshold | Operation mode | Actions | | |
|---|---|---|---|---|
| | | Operation mode | Control unit | Memory access |
| | M1 | Normal operation | maximum speed operation | maximum speed access |
| T1 | | | | |
| | M2 | Low-speed temperature dropping | decelerating operation | maximum speed access |
| T2 | | | | |
| | M3 | High-speed temperature dropping | Low speed operation | Low-speed access |
| T3 | | | | |
| | M4 | Over-heated error | Respond with error message | Stop access |

FIG. 4

SOLID STATE SEMICONDUCTOR STORAGE DEVICE WITH TEMPERATURE CONTROL FUNCTION, APPLICATION SYSTEM THEREOF AND CONTROL ELEMENT THEREOF

BACKGROUND OF THE INVENTION

1. Field of the Invention

The present invention is related to a solid state semiconductor storage device with non-volatile memory, and more particularly to a solid state semiconductor storage device with temperature control function and a temperature controlling method thereof.

2. Description of Related Art

Solid state semiconductor storage devices become more and more popular. There are many applications utilizing solid state non-volatile memory to record digital information, such as USB flash drive, memory card, and solid state disk (SSD) drive. The solid state disk drive, which has the biggest capacity, is suitable to replace the hard disk drive in a portable computer (such as notebook, and ultra-mobile PC (UMPC)), so as to provide the properties of low power consumption, high storage speed and high reliability. For providing higher storage capacity and accessing speed, the solid state semiconductor storage device needs plural non-volatile memories, such that the operations of data access, recording and erasing can be performed at the same time, thereby reducing the operation time and therefore improving the accessing speed.

Please refer to FIG. 1, which is a block diagram showing the conventional solid state disk drive. The solid state disk drive 1 includes power managing unit 11, non-volatile memory unit 12 and control unit 13. The power managing unit 11 receives the power from the application system (not shown) and converts the power into a form suitable for other units inside the solid state disk drive. The control unit 13 connects to the system through the system interface for receiving commands and controls the non-volatile memory unit 12 to execute data input, data output, memory page write-in, memory block erasing and other necessary operations. Further, in the control unit 13, the system interface 131 is used to connect to the system, the memory interface 132 is used to connect to the non-volatile memory unit 12, and the microprocessor 133 executes the commands of the system and controls data transmission, the non-volatile memory unit 12 and data buffering in the data transmission buffer 134. The non-volatile memory unit 12 is constituted by at least one or more non-volatile memories, and it receives the control command from the control unit 13 so as to record digital information and provide thereof to the system.

U.S. Pat. No. 6,725,321 entitled "Memory system", U.S. Pat. No. 6,718,406 entitled "Memory array apparatus with reduced data accessing time and method for the same", and US Patent Application Publication No. 20050010717 entitled "Access and data management method using double parallel tracks for flash memory cells" provide the system architecture of solid state disk drive and method thereof. However, since inside the solid state disk drive there are many electronic elements operating at the same, they will produce much heat in the portable computer, and the increase in temperature may cause unstable operation.

FIG. 2 shows a conventional memory system with temperature control device for preventing unstable operation caused by temperature alteration. The memory system 300 includes a controller 310 and a memory device 320, wherein the controller 310 reads/writes the memory device 320 through a USB (Universal Serial Bus) 300. The controller 310 includes a track circuit 316 and a control circuit 315, wherein the track circuit 316 is used to monitor the operation of the memory device 320 in a particular duration, including the number of reading/writing or the number of updating. The control circuit 315 can decide the operation temperature of the memory device 320 in the particular duration according to the information provided by the track circuit 316, which monitors the operation of the memory device 320, and the former operation information of the memory device 320. Then, if the control circuit 315 decides that the operation temperature of the memory device 320 has exceeded the tolerant range, it will modulate the memory device 320 for reducing the operation temperature by inserting a delay time between read/write operations, or by switching the memory device 320 to a low power mode.

However, the technology described above is only suitable for volatile memory whose heat dispersing is related to the read/write speed of the memory controller as accessing the memory. Since the solid state disk drive adopts non-volatile memory (such as NAND type flash memory) for long-term data storage, the access process and characteristics thereof are quite different from volatile memory. For example, the difference of NAND type flash memory, which is adopted by the current solid state disk drive, from volatile RAM are:

1. The data stored in the NAND-type flash memory can not be randomly accessed, and the access operation should be executed through the instruction code and also has a designated procedure that the access size is larger, such as memory page or memory block.

2. The NAND-type flash memory, except the common data input/output operation like the volatile RAM, further needs to write in memory page or erase memory block for completing data recording.

3. The power consumption is much higher, since the NAND-type flash memory needs more time to execute memory page write-in or memory block erasing, and thus, the produced heat is also higher.

According to the differences, it is known that NAND-type flash memory has different characteristics from the volatile RAM, so that the above-described temperature control technology is not suitable for the solid state disk drive or other solid state semiconductor storage device. Therefore, there still exists the need to solve the problem of unstable operation caused by high temperature in the solid state semiconductor storage device.

SUMMARY OF THE INVENTION

Consequently, for avoiding the solid state semiconductor storage device to become unstable under high temperature, a temperature control device should be installed in the solid state semiconductor storage device and a more effective temperature control method also should be provided.

For achieving the object described above, the present invention provides a solid state semiconductor storage device with temperature control function including a non-volatile memory unit, a temperature sensing element, and a control unit. The temperature sensing element is used to sense the operation temperature of the solid state semiconductor storage device so as to provide a temperature sensing signal. The control unit is electrically connected to an application system through a system interface so as to receive commands from the application system, is electrically connected to the non-volatile memory unit through a memory interface and is electrically connected to the temperature sensing element through a temperature sensing interface so as to receive the temperature sensing signal. The control unit further includes a microprocessor, electrically connected to the system interface, the memory interface and the temperature interface respectively, whereby the microprocessor decides the operation temperature of the solid state semiconductor storage device according to the temperature sensing signal and executes a corresponding procedure for adjusting the operation mode of the solid state semiconductor storage device.

For achieving the object described above, the present invention further provides a method for controlling temperature of a solid state semiconductor storage device, including steps of: presetting temperature thresholds in a control unit according to different operation modes, detecting the operation temperature of the solid state semiconductor storage device through a temperature sensing element and sending out a temperature sensing signal back to the control unit, comparing the temperature sensing signal with the temperature threshold through the control unit and controlling the action of the solid state semiconductor storage device according to the comparison result.

Therefore, in the present invention, according to the comparison result between the temperature threshold and the operation temperature of the solid state semiconductor storage device, the control unit can enter different operation modes, and in different operation modes, the control unit has different command executing speeds and different accessing speeds to the non-volatile memory unit, thereby achieving an effective temperature control.

BRIEF DESCRIPTION OF THE DRAWINGS

The foregoing aspects and many of the attendant advantages of this application will be more readily appreciated as the same becomes better understood by reference to the following detailed description, when taken in conjunction with the accompanying drawings, wherein:

FIG. 4 is a table showing the relationship between temperature sensing results and operation modes of the solid state semiconductor storage device in a preferred embodiment according to the present invention;

DETAILED DESCRIPTION OF PREFERRED EMBODIMENTS

Figure 1:
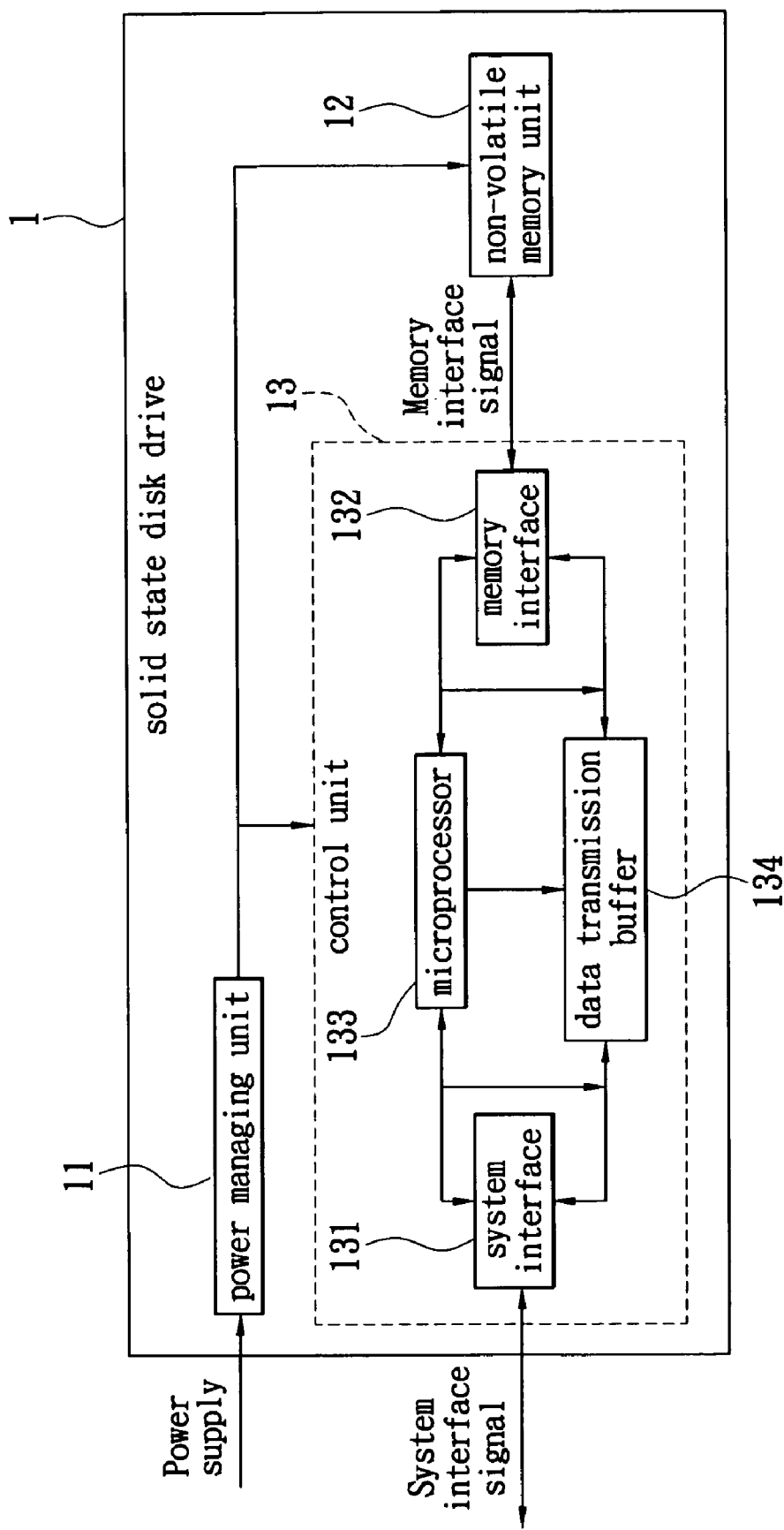
FIG. 1 is a block diagram showing the conventional solid state disk drive.
Figure 2:
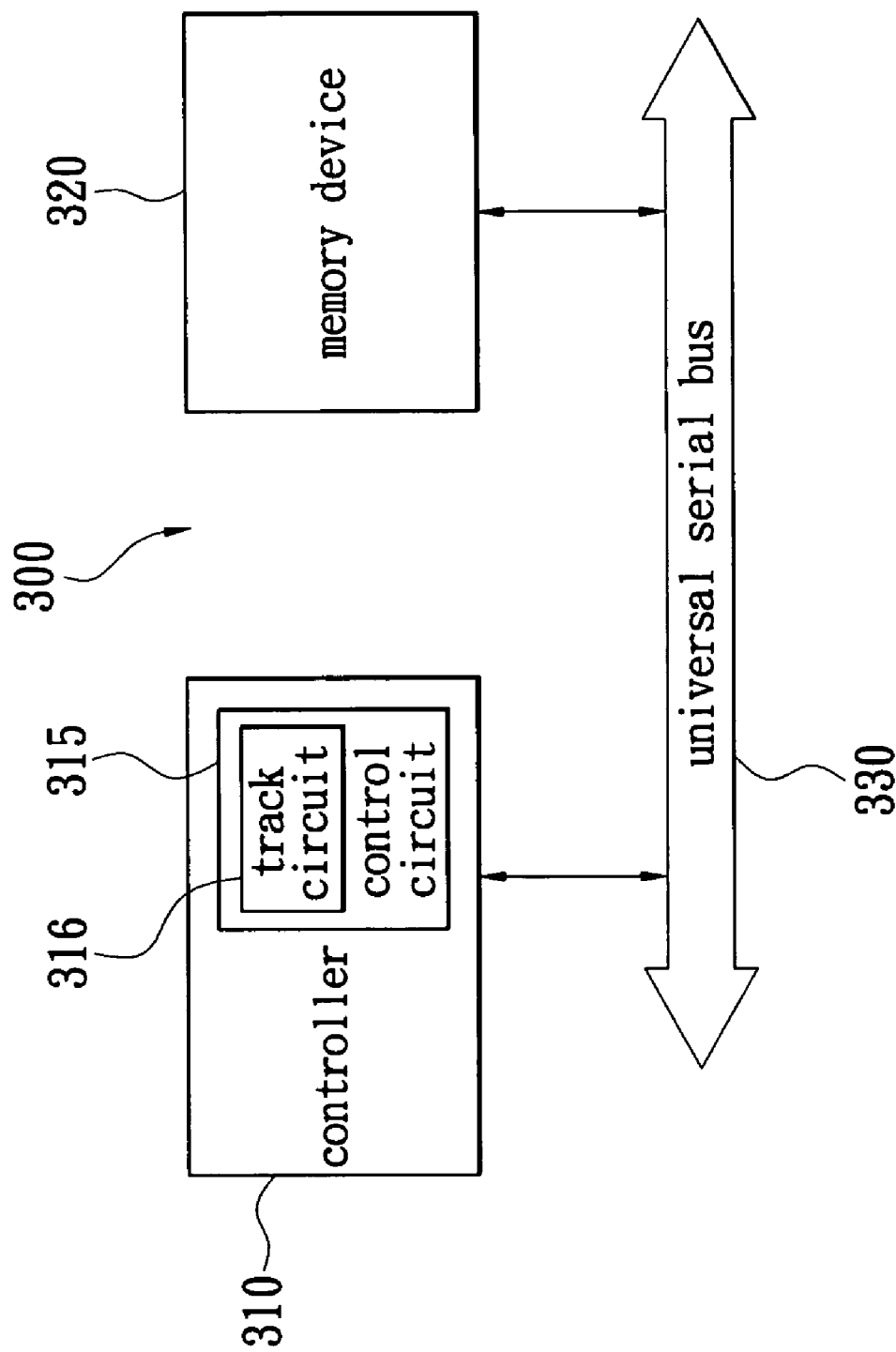
FIG. 2 is a block diagram showing a conventional memory system with temperature control device.
Figure 3:
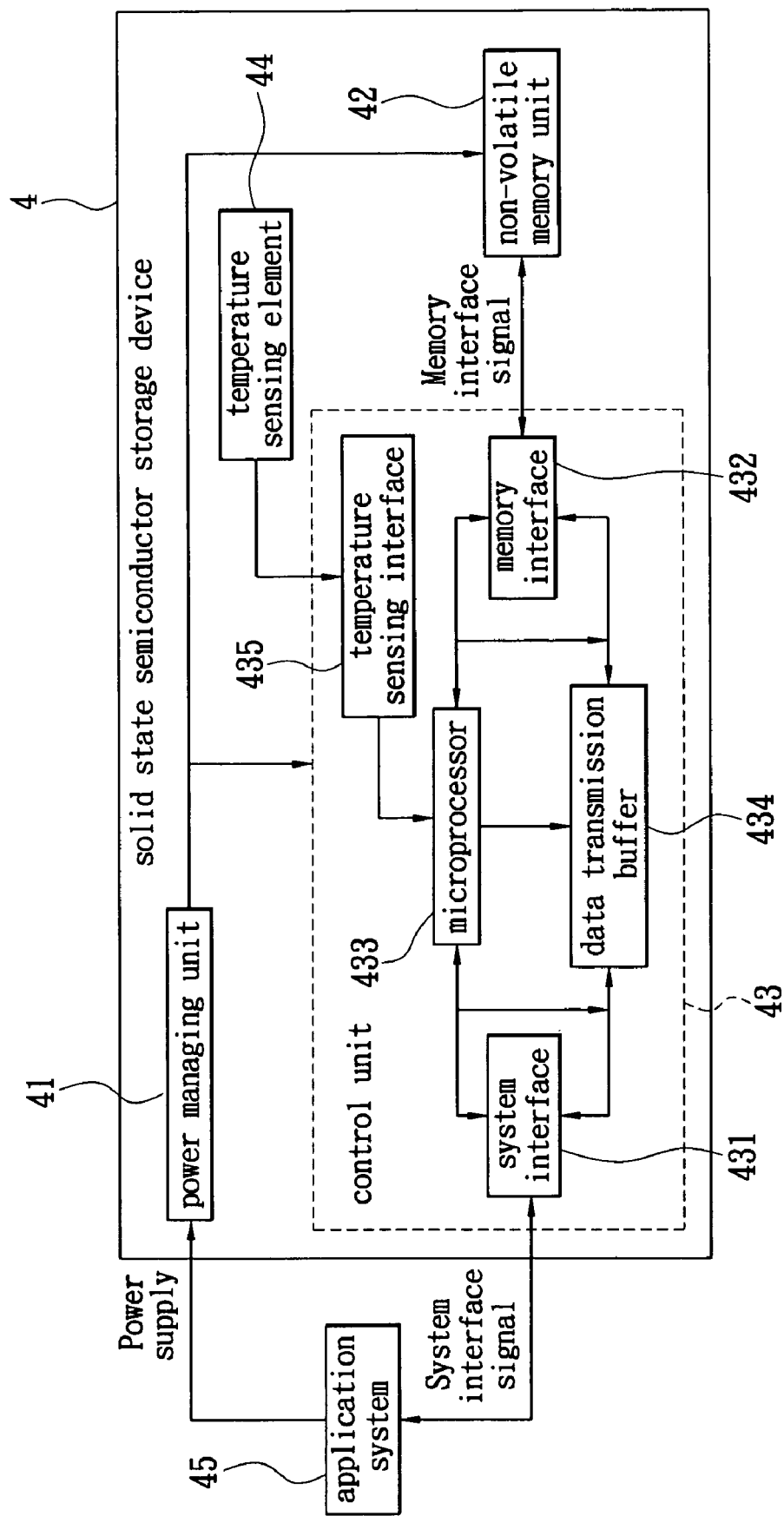
FIG. 3 is a block diagram showing a solid state semiconductor storage device with temperature control function according to the present invention.

Please refer to FIG. 3, which is a block diagram showing a solid state semiconductor storage device with temperature control function according to the present invention. As shown, the solid state semiconductor storage device 4 with temperature control function includes a power managing unit 41, a non-volatile memory unit 42, a control unit 43 and a temperature sensing element 44. The power managing unit 41 receives power from the motherboard or an application system 45 (such as, computer, PDA or various digital multimedia devices) and converts the power into a power form suitable for all units inside the solid state semiconductor storage device 4. The control unit 43 connects to the application system 45 through a system interface 431 for receiving commands, so as to execute data input, data output, memory page write-in, memory block erasing and other necessary operations. In the control unit 43, the system interface 431 is used to connect to the application system 45 and a memory interface 432 is used to connect to the non-volatile memory unit 42. In addition, the control unit 43 further includes a microprocessor 433 which is responsible for executing the commands from the application system 45, controlling data transmission and data access to the non-volatile memory unit 42, and controlling data buffering in a data transmission buffer 434. The non-volatile memory unit 42 is constituted by more than one non-volatile memory, and it receives the control command from the control unit 43 to record digital information or provide thereof to the application system 45, and to store some control information of the control unit 43.

The temperature sensing element 44 is used to sense the operation temperature of the solid state semiconductor storage device 4 and, through a temperature sensing interface 435 on the control unit 43, the temperature sensing signal can be provided to the microprocessor 433. The microprocessor 433 decides the operation temperature of the solid state semiconductor storage device 4 according to the temperature sensing signal provided by the temperature sensing element 44 and changes the operation mode of the solid state semiconductor storage device 4 when the temperature sensing signal reaches a preset temperature threshold, so as to modulate the control unit 43 to respond to the execution speed commanded by the application system 45 and to control the access method of the control unit 43 to the non-volatile memory unit 42. Here, the temperature sensing element 44 can be a thermocouple temperature sensing element.

The solid state semiconductor storage device 4 can preset the temperature threshold in the control unit 43, the non-volatile memory unit 43 or the temperature sensing element 44, and the temperature sensing element 44 can combine with a comparison circuit for comparing the temperature sensing signal with the present temperature threshold, so as to transmit the result to the control unit 43. Moreover, except being preset in the unit or element, the temperature threshold also can be set or modified through the application system 45, so that, according to the operation property, the solid state semiconductor storage device 4 can preset multiple temperature thresholds and corresponding operation modes, thereby the device can enter different operation mode as the operation temperature achieves different temperature thresholds. Following, an operation mode with three preset temperature thresholds and four corresponding operation modes is described for illustration.

Figure 5:
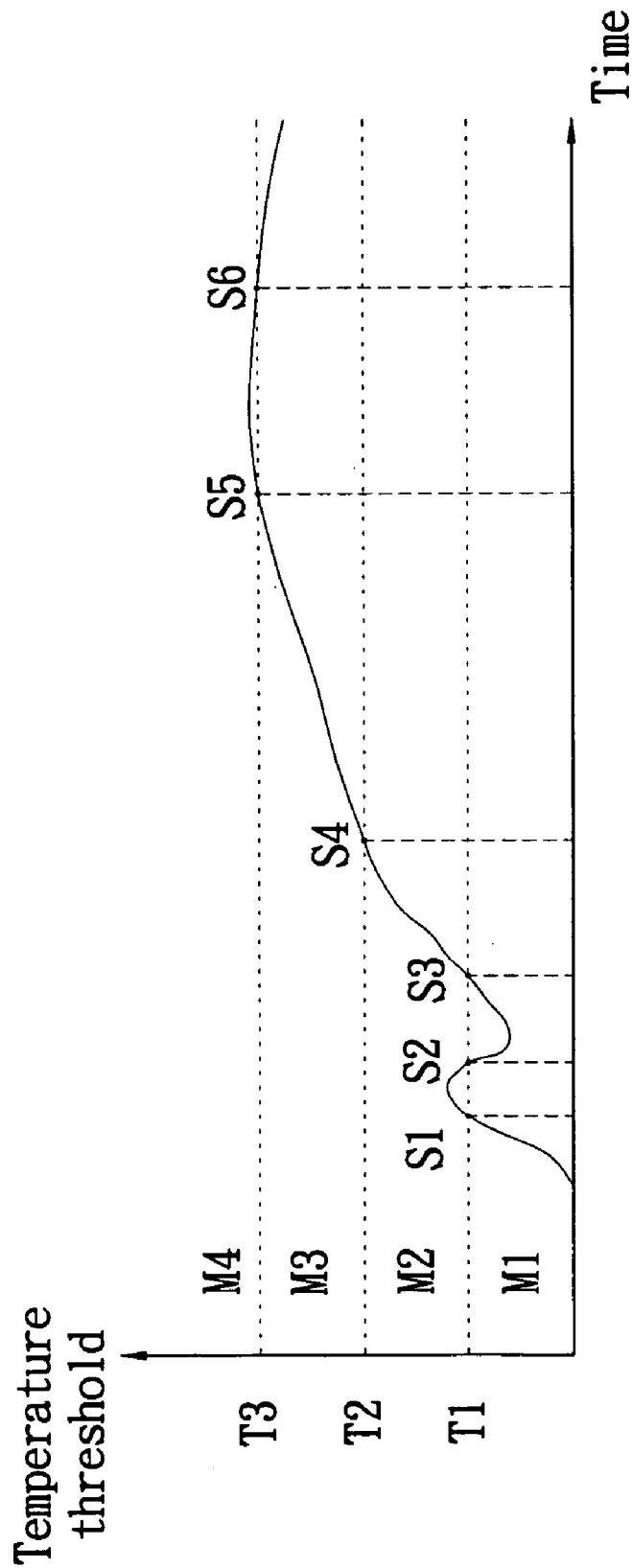
FIG. 5 is a graph showing the variations of temperature sensing signals and the operation modes in accordance with time and condition differences in the solid state semiconductor storage device of a preferred embodiment according to the present invention.

Please refer to FIG. 4 which is a table showing the relationship between temperature sensing results and operation modes of the solid state semiconductor storage device in a preferred embodiment according to the present invention, and FIG. 5 which is a graph showing the variations of temperature sensing signals and the operation modes in accordance with time and condition differences in the solid state semiconductor storage device of a preferred embodiment according to the present invention.

When the temperature sensing signal of the solid state semiconductor storage device 4 is lower than a first temperature threshold T1, the solid state semiconductor storage device 4 enters a first operation mode M1, namely the normal operation mode. At this time, the control unit 43 accesses the non-volatile memory unit 42 at maximum speed, and in the first operation mode M1, the solid state semiconductor storage device 4 provides the best access efficiency but also the highest power consumption and heat generation.

When the temperature sensing signal outputted by the sensing element 44 of the solid state semiconductor storage device 4 is higher than the first temperature threshold T1, the storage device enters a second operation mode M2, namely a low-speed temperature dropping mode, as indicated by S1 shown in FIG. 5. At this time, the control unit 43 enters a decelerating operation, that is, the speed of the control unit 43 to execute the commands from the application system 45 becomes slower but the access to the non-volatile memory unit 42 is still at maximum speed. In the second operation mode M2, the access efficiency and the power consumption of the solid state semiconductor storage device 4 are lower than the first operation mode M1, so that the temperature can be slightly dropped without influencing the data access efficiency. If the application system 45 does not continuously access a large amount of data to the solid state semiconductor storage device 4, generally, the inner operation temperature will gradually drop to a temperature lower than the first temperature threshold T1, and thus, the control unit 43 switches back to the first operation mode for providing the best data access efficiency, as indicated by S1 to S2 shown in FIG. 5.

If the application system 45 continuously accesses a large amount of data to the solid state semiconductor storage device 4, or the surrounding temperature of the solid state semiconductor storage device 4 is high or the heat surrounding thereof is difficult to disperse, then even the control unit 43 enters the second operation mode M2 for executing the decelerating operation, the temperature still can not be dropped. At this time, the temperature continuously raises, as indicated by S3 to S4 shown in FIG. 5. When the inner temperature sensing signal is higher than a second temperature threshold T2, the solid state semiconductor storage device 4 enters a third operation mode M3, namely a high-speed temperature dropping mode, for further reducing the operation speed of the control unit 43 and simultaneously reducing the accessing speed to the non-volatile memory unit 42, thereby achieving the purpose of maintaining stable operation under serious condition, as indicated by S4 shown in FIG. 5.

The reduction of the accessing speed to the non-volatile memory unit 42 includes reducing the transmission rate of data input/output, reducing the memory page write-in operation parallel or interlaced, reducing the memory block erasing operation parallel or interlaced, increasing the time interval for executing the memory page write-in operation and increasing the time interval for executing the memory block erasing operation.

If the environment for installing the solid state semiconductor storage device 4 is influenced by other heat sources or is difficult to disperse heat, the inner temperature still might continuously raise even the third operation mode M3 has executed to highly drop the temperature. As indicated by S4 to S5 shown in FIG. 5, even the solid state semiconductor storage device 4 enters the third operation mode M3, the temperature raising is only slowed down but not inhibited. At this time, the operation temperature continuously raises until higher than a tolerance for maintaining the stable operation, and the temperature sensing signal achieves a third temperature threshold T3, as indicated by S5 shown in FIG. 5. Since the operation temperature exceeds the upper tolerance for maintaining the stable operation of the solid state semiconductor storage device 4, the control unit 43 enters a fourth operation mode M4 for responding to an over-heated error. At this time, the commands from the application system 45 are all responded with error messages by the control unit 43, and the access to the non-volatile memory unit 42 is stopped until the inner temperature drops to a temperature lower than the third temperature threshold T3 and the control unit 43 returns to the third operation mode M3, as indicated by S6 shown in FIG. 5.

Therefore, the solid state semiconductor storage device with temperature control function alters the operation speed of the control unit 43 and the accessing speed to the non-volatile memory unit 42 according to the temperature sensing results, so that the heat can be effectively dispersed and thus the stable operation can be achieved.

Figure 6:
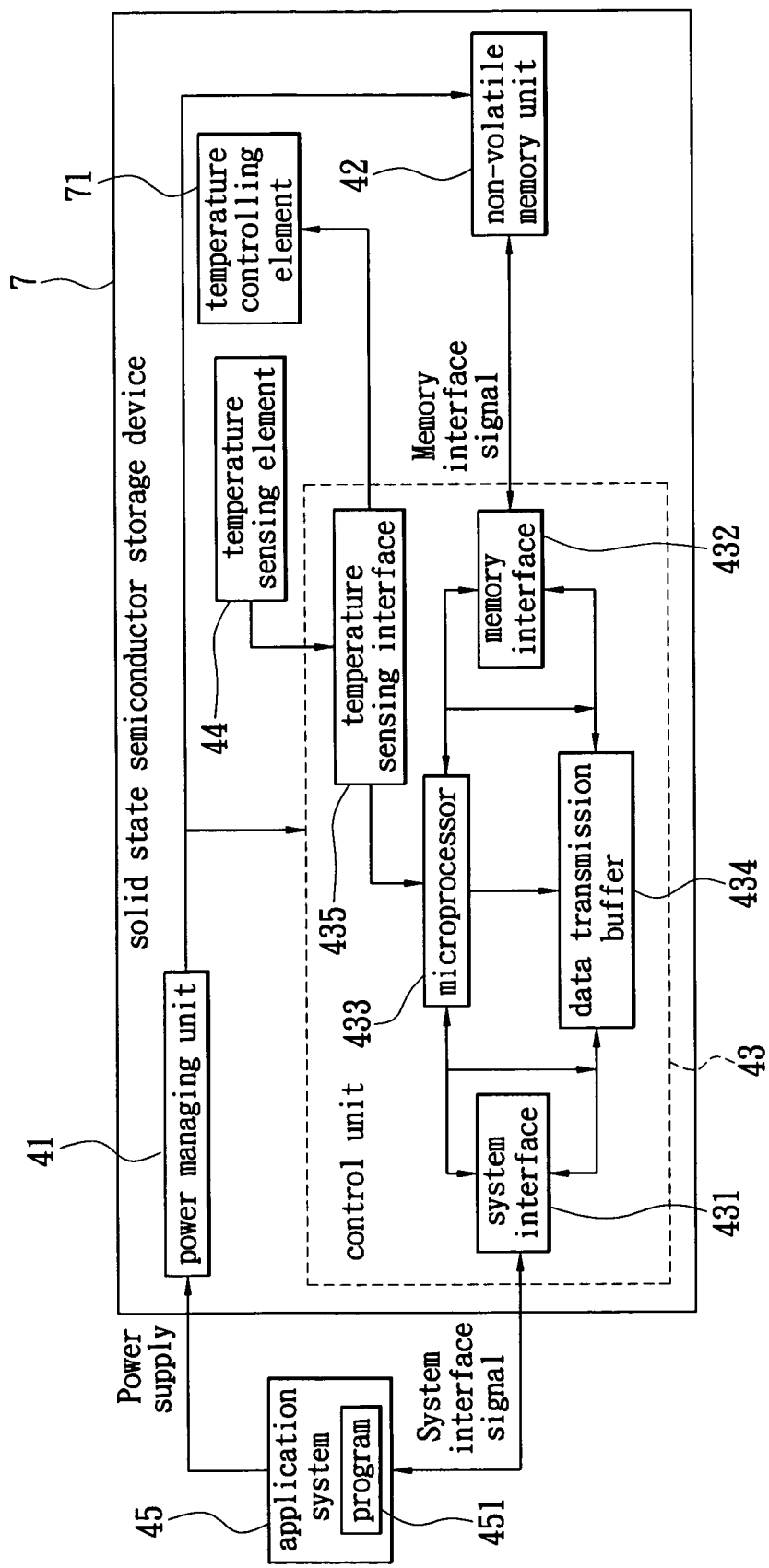
FIG. 6 is a block diagram showing the solid state semiconductor storage device with temperature control function in another preferred embodiment of the present invention.

Please refer to FIG. 6, which is a block diagram showing the solid state semiconductor storage device with temperature control function in another preferred embodiment of the present invention. As shown, in the solid state semiconductor storage device 7, except the temperature sensing element 44, a temperature controlling element 71 is further included. When the temperature sensing element 44 senses that the inner temperature exceeds a preset temperature, the control unit 43, except alters the operation speed and the accessing speed to the non-volatile memory unit 42, also initiates the temperature controlling element 71 for improving the heat dispersing efficiency and accelerating the temperature dropping. Here, the temperature controlling element 71 can be a power driven fan or a solid state cooling device.

Moreover, the application system 45, which is connected to the solid state semiconductor storage device 7, also can execute a program 451 for monitoring the inner operation temperature of the storage device 7. When the inner temperature sensing signal exceeds a preset value, the control unit 43 transmits a signal back to the program 451 through the system interface 431, and the program 451 produces a message to inform the user of the application system 45 or another temperature controlling element in the system.

Figure 7:
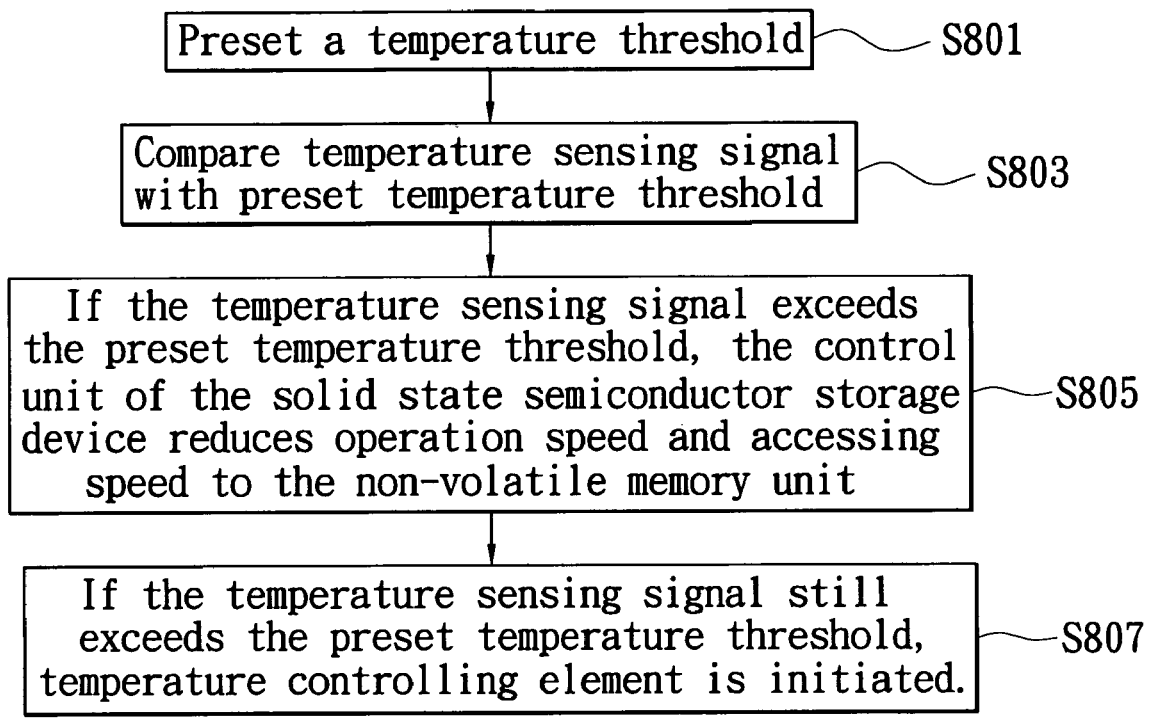
FIG. 7 is a flow chart showing the temperature controlling method of the solid state semiconductor storage device according to the present invention.

Please refer to FIG. 7, which is a flow chart showing the temperature controlling method of the solid state semiconductor storage device according to the present invention. First, a temperature threshold is preset in the solid state semiconductor storage device (S801). Then, the temperature sensing element senses the operation temperature of the solid state semiconductor storage device, and the control unit compares the operation temperature of the solid state semiconductor storage device with the preset temperature threshold (S803). If the operation temperature of the solid state semiconductor storage device exceeds the temperature threshold, the control unit reduces the operation speed and the accessing speed to the non-volatile memory unit (S805). The methods of the control unit to control the operation speed and the accessing speed are the control unit reduces the speed for executing the commands from the application system and accesses the non-volatile memory unit at maximum speed, the control unit executes the commands from the application system at a lower speed and reduces the accessing speed to the non-volatile memory unit, and the control unit responds the commands from the application system with error messages and stops the access to the non-volatile memory unit.

Following, if the temperature sensing signal of the solid state semiconductor storage device exceeds the temperature threshold, the temperature controlling element in the solid state semiconductor storage device is further initiated (S807). And, the application system, which is connected to the solid state semiconductor storage device, can further execute a program for receiving the message of temperature sensing condition, so as to inform the user of the application system or correspondingly initiate a processing procedure.

Figure 8:
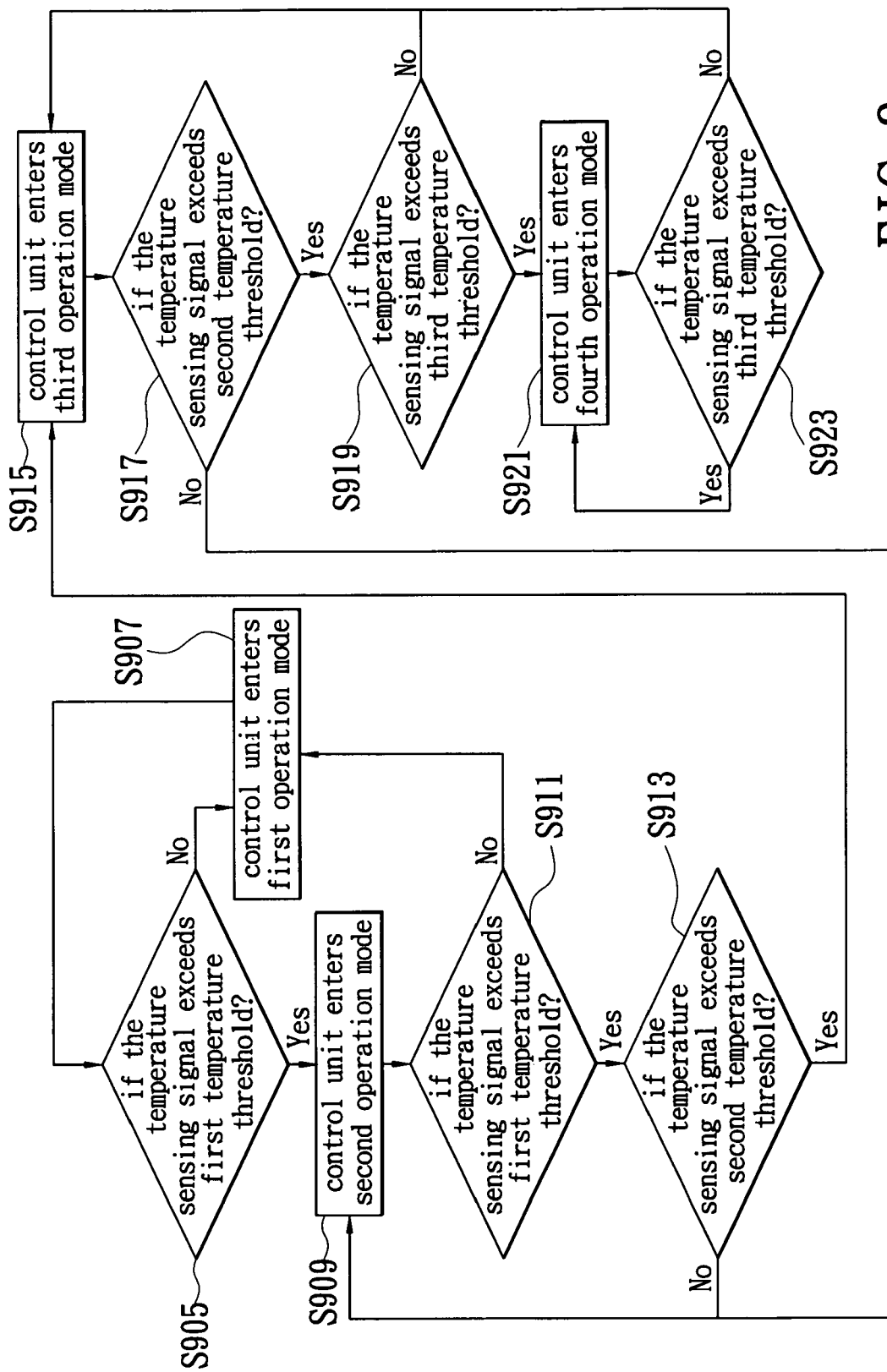
FIG. 8 is a flow chart showing the temperature control method of the solid state semiconductor storage device in a preferred embodiment according to the present invention.

Please refer to FIG. 8, which is a flow chart showing the temperature control method of the solid state semiconductor storage device in a preferred embodiment according to the present invention. First, in the control unit of the solid state semiconductor storage device, a first temperature threshold, a second temperature threshold and a third temperature threshold are preset, thereby the operation mode of the control unit can be divided into a first operation mode, a second operation mode, a third operation mode and a fourth operation mode. In the first operation mode, the control unit executes the commands from the application system at maximum speed and accesses the non-volatile memory unit at maximum speed, too. In the second operation mode, the control unit reduces the speed for executing the commands from the application system and accesses the non-volatile memory unit at maximum speed. In the third operation mode, the control unit executes the commands from the application system at a lower speed and reduces the accessing speed to the non-volatile memory unit. In the fourth operation mode, the control unit responds the commands from the application system with error messages and stops the access to the non-volatile memory unit.

After initiating the solid state semiconductor storage device, a temperature sensing element is used to detect the operation temperature of the storage device. Then, the control unit decides that if the operation temperature of the storage device exceeds the first temperature threshold (S905). If not, the control unit enters the first operation mode (S907) and continues the detection and the decision.

If the temperature sensing signal of the solid state semiconductor storage device exceeds the first temperature threshold, the control unit enters the second operation mode (S909) and then continuously detects and decides if the temperature sensing signal is lower than the first temperature threshold (S911). If the temperature sensing signal is lower than the first temperature threshold, the method backs to step S907. And, if the temperature sensing signal is not lower than the first temperature threshold, the control unit will decide that if the temperature sensing signal exceeds the second temperature threshold (S913).

If the temperature sensing signal of the solid state semiconductor storage device does not exceed the second temperature threshold, the method backs to step S909. And, if the temperature sensing signal of the solid state semiconductor storage device exceeds the second temperature threshold, the control unit enters the third operation mode (S915) and continuously detects and decides if the temperature sensing signal is lower than the second temperature threshold (S917). If the temperature sensing signal of the solid state semiconductor storage device is lower than the second threshold, the method backs to step S909. And, if the temperature sensing signal is not lower than the second temperature threshold, the control unit will decide that if the temperature sensing signal of the solid state semiconductor storage device exceeds the third temperature threshold (S919). If the temperature sensing signal does not exceed the third temperature threshold, the method backs to step S915. And, if the temperature sensing signal exceeds the third temperature threshold, the control unit enters the fourth operation mode (S921) and continuously detects and decides if the temperature sensing signal is lower than the third temperature threshold (S923). If the temperature sensing signal of the solid state semiconductor storage device is not lower than the third temperature threshold, the method backs to step S921. And, if the temperature sensing signal of the solid state semiconductor storage device is lower than the third temperature threshold, the methods backs to step S915.

In the aforesaid, for avoiding the solid state semiconductor storage device from being unstable under high temperature, the present invention provides an effective solid state semiconductor storage device with temperature control function and a temperature control method thereof, so that the solid state semiconductor storage device can be modulated into proper operation modes according to the operation temperatures for executing related temperature control mechanism, thereby reducing the heat and therefore maintaining a stable operation.

It is to be understood, however, that even though numerous characteristics and advantages of the present application have been set forth in the foregoing description, together with details of the structure and function of the application, the disclosure is illustrative only, and changes may be made in detail, especially in matters of shape, size, and arrangement of parts within the principles of the application to the full extent indicated by the broad general meaning of the terms in which the appended claims are expressed.

What is claimed is:

1. An application system comprising a solid state semiconductor storage device with temperature control function, wherein the solid state semiconductor storage device comprises:
   a non-volatile memory unit storing digital information;
   a temperature sensing element sensing an operation temperature of the solid state semiconductor storage device and producing a corresponding temperature sensing signal; and
   a control unit electrically connected to the temperature sensing element and the non-volatile memory unit, said control unit receiving said corresponding temperature sensing signal from the temperature sensing element, comparing said corresponding temperature sensing signal with at least one predetermined temperature threshold, and executing a corresponding procedure according to a result of the comparison,
   wherein said control unit executes said corresponding procedure by adjusting a speed of executing commands issued by the application system.

2. The application system as claimed in claim 1, wherein said at least one predetermined temperature threshold is preset in said solid state semiconductor storage device.

3. The application system as claimed in claim 1, further comprising a temperature controlling element coupled to said control unit, wherein said control unit actuates said temperature controlling element in accordance with said comparison results.

4. The application system as claimed in claim 1, wherein said control unit further executes said corresponding procedure by transmitting a signal to the application system, said signal indicating the execution of said corresponding procedure.

5. The application system as claimed in claim 1, wherein said control unit further executes said corresponding procedure by adjusting an accessing speed to the non-volatile memory unit.

6. The application system as claimed in claim 1, wherein said control unit further executes said corresponding procedure by executing commands from the application system at a maximum speed in the storage device.

7. The application system as claimed in claim 1, wherein said control unit further executes said corresponding procedure by executing commands from the application system at a speed lower than a maximum speed of the storage device.

8. The application system as claimed in claim 1, said control unit further executes said corresponding procedure by accessing the non-volatile memory unit at a maximum speed or at a speed lower than the maximum speed, or stops accessing the non-volatile memory unit.

9. The application system as claimed in claim 8, wherein the speed lower than maximum speed for the control unit to access the non-volatile memory unit is achieved by at least one of the following steps: reducing the data input/output transmission rate, reducing memory page write-in operation parallel or interlaced, reducing memory block erasing operation parallel or interlaced, increasing the time interval for executing the memory page write-in operation, and increasing the time interval for executing the memory block erasing operation.

10. The application system as claimed in claim 3, wherein said temperature controlling element is actuated for reducing the temperature of the storage device.

11. The application system as claimed in claim 10, wherein the temperature controlling element is a power-driven fan or a solid state cooling device.

12. The application system as claimed in claim 1, further comprising a software unit receiving a signal outputted from the solid state semiconductor storage device and producing a temperature monitoring signal of the storage device.

13. A solid state semiconductor storage device having non-volatile memory mounted therein and at least one temperature threshold preset therein, the device comprising:
   a control unit electrically connected to the non-volatile memory; and
   a temperature sensing element electrically connected to the control unit for detecting an operation temperature of the storage device and outputting a temperature sensing signal, wherein said control unit compares said temperature sensing signal with said at least one temperature threshold, and executes a corresponding procedure according to a result of the comparison by adjusting a speed of executing commands issued by the application system.

14. The solid state semiconductor storage device as claimed in claim 13, wherein the control unit receives a signal from the temperature sensing element and executes the corresponding procedure according to the signal.

15. A control element used for controlling a non-volatile memory unit, comprising:
   a system interface electrically connected to an application system for receiving commands from the system;
   a memory interface electrically connected to the non-volatile memory unit;
   a temperature sensing interface electrically connected to a temperature sensing element for receiving a temperature sensing signal transmitted from the temperature sensing element; and
   a microprocessor electrically connected to the system interface, the memory interface, and the temperature interface, wherein said microprocessor includes at least one temperature threshold preset therein, said microprocessor executing a corresponding procedure in accordance with a result of comparison between said temperature sensing signal and said at least one preset temperature threshold by adjusting a speed of executing commands issued by the application system;
   wherein the microprocessor controls the non-volatile memory unit through the memory interface; and
   wherein the microprocessor receives and executes the commands from the application system through the system interface.

* * * * *